(12) United States Patent
Shi et al.

(10) Patent No.: US 7,035,835 B2
(45) Date of Patent: Apr. 25, 2006

(54) HIGH-PRECISION CURRENT-MODE PULSE-WIDTH-MODULATION CIRCUIT

(75) Inventors: Bingxue Shi, Beijing (CN); Lu Chen, Beijing (CN); Chun Lu, Beijing (CN)

(73) Assignee: Winbond Electronics Corporation, Hsinchu (TW)

( * ) Notice: Subject to any disclaimer, the term of this patent is extended or adjusted under 35 U.S.C. 154(b) by 475 days.

(21) Appl. No.: 10/459,538

(22) Filed: Jun. 12, 2003

(65) Prior Publication Data

US 2004/0251941 A1    Dec. 16, 2004

(51) Int. Cl.
*G06F 15/18* (2006.01)
(52) U.S. Cl. .......................... 706/28; 706/34; 327/103; 327/172
(58) Field of Classification Search .................. 706/28, 706/34
See application file for complete search history.

(56) References Cited

U.S. PATENT DOCUMENTS

| | | | | |
|---|---|---|---|---|
| 5,696,883 A | * | 12/1997 | Arima | 706/38 |
| 6,320,427 B1 | | 11/2001 | Shi et al. | 327/77 |
| 6,456,992 B1 | * | 9/2002 | Shibata et al. | 706/33 |
| 6,756,831 B1 | * | 6/2004 | Shi et al. | 327/172 |
| 6,809,558 B1 | * | 10/2004 | Shi et al. | 327/103 |
| 6,946,894 B1 | * | 9/2005 | Shi et al. | 327/356 |
| 2003/0117222 A1 | * | 6/2003 | Anderson | 331/100 |
| 2004/0017236 A1 | * | 1/2004 | Shi et al. | 327/172 |

OTHER PUBLICATIONS

Kazmierkowski et al, "Current Control Techniques for Three-Phase Voltage-Source PWM Convertors: A Survey", IEEE Transactions on Industrial Electronics, Oct. 1998.*

* cited by examiner

*Primary Examiner*—George Davis
(74) *Attorney, Agent, or Firm*—Finnegan, Henderson, Farabow, Garrett & Dunner, L.L.P.

(57) ABSTRACT

A current-mode pulse-width-modulation (PWM) circuit converts analog current signals into pulse signals. The PWM circuit includes a first I-V converter and one or more second I-V converters, each of the one or more second I-V converters being coupled to one of the current signals. Each of the first and second I-V converters is also coupled to a current generator which generates a current that linearly changes with time. For each of the first and second I-V converters, when a polarity of the input current thereof changes, an output changes between a high voltage level and a low voltage level. A logic circuit is coupled to the first and each second I-V converter to obtain a pulse signal that has a pulse width linearly proportional to the current level of the respective current signal.

24 Claims, 5 Drawing Sheets

HIGH-PRECISION CURRENT-MODE PULSE-WIDTH-MODULATION CIRCUIT

DESCRIPTION OF THE INVENTION

1. Field of the Invention

This invention relates to a pulse-width-modulation circuit and, more particularly, to a current-mode pulse-width-modulation circuit.

2. Background of the Invention

The application of an artificial neural network as a signal processing technique has been considered, and theories, modeling, and algorithms relating to such applications of neural networks continue to be developed. However, a limited availability of suitable integrated circuits has become a bottleneck for further development of artificial neural networks. In choosing a suitable circuit structure for implementing a neural network circuit, a digital circuit, an analog circuit, or a hybrid of both may be considered, depending on the requirements of precision, scale, speed, etc.

A digital circuit can be configured to have very high precision. Also, digital circuits experience fewer adverse effects and less serious problems caused by noise than analog circuits, therefore, signal transmission is easier for a digital circuit. However, because a digital circuit may take up a very large chip area, it may be more difficult to implement for a large-scale neural network. Moreover, since digital circuits generally work in a synchronous mode, i.e., they have to be synchronized to an external clock signal, their operation speed is greatly limited.

In contrast to a digital circuit, an analog circuit saves chip area and has faster speed, but has a lower precision. Such lower precision may be less desirable for neural network applications.

An analog/digital (A/D) hybrid circuit, particularly, a pulse-based circuit, can provide advantages of both an analog circuit and a digital circuit. For example, a pulse-based circuit may exhibit desirable noise immunity and easier signal transmission of a digital circuit, while requiring smaller chip area and providing the faster operating speed of an analog circuit. Although the pulse-based circuit generates switching noise and increases circuit complexity, potential problems may be minimized or eliminated by adjusting the circuit configuration.

For a pulse-based circuit, there are several ways of modulating pulses. For example, pulse-width-modulation (PWM) has been considered suitable for implementation in VLSI technology. Implementations of PWM neural network circuits have been developed and include a synapse multiplier, a nonlinear neuron unit, and a PWM unit. The PWM unit receives analog signals from the neuron unit and converts them into pulse signals by modulating pulse widths. Depending on the type of analog signals, there are two different types of PWM circuits: a current-mode PWM circuit and a voltage-mode PWM circuit. The current-mode PWM circuit receives current input signals, while the voltage-mode PWM circuit receives voltage input signals.

The current mode PWM circuit includes desirable features of smaller chip area and faster speed, operability with lower power supply voltages, and compatibility with digital CMOS integrated circuit technologies. A PWM unit in a current-mode PWM neural network circuit can be implemented as a current-to-pulse converter circuit. The conversion precision of the converter circuit determines the precision of the neural network circuit.

SUMMARY OF THE INVENTION

In accordance with the present invention, there is provided a pulse-width-modulation (PWM) circuit for converting a current signal to a pulse signal that includes a first current generator for generating a first current that changes with time, a first I-V converter coupled to the first current generator for receiving the first current, a second current generator for generating a second current that changes with time, a second I-V converter coupled to receive the current signal and coupled to the second current generator to receive the second current, and a logic circuit coupled to the first and second I-V converters for outputting the pulse signal, a pulse width of the pulse signal representing a current level of the current signal.

Also in accordance with the present invention, there is provided a pulse-width-modulation (PWM) circuit for converting a plurality of current signals into a plurality of pulse signals that includes a first circuit, the first circuit including a first current generator for generating a first current, and a first I-V converter coupled to the first current; and a plurality of second circuits, each second circuit being coupled to a corresponding one of the plurality of current signals for converting the corresponding current signal into a corresponding one of the plurality of pulse signals, each second circuit including a second current generator for generating a second current, a second I-V converter coupled to the corresponding current signal and the second current, and a logic circuit coupled to the second I-V converter and the first I-V converter for outputting the corresponding pulse signal, wherein a pulse width of the corresponding pulse signal represents a current level of the corresponding current signal.

Still in accordance with the present invention, there is provided a method for converting a current signal into a pulse signal that includes providing a first I-V converter and a second I-V converter each having a current input and a voltage output, wherein the voltage output changes between a high voltage level and a low voltage level when the current input changes polarity; generating a first current and a second current, both of the first and second currents changing with time in accordance with a same coefficient, wherein the first current changes polarity at a first time, and the sum of the second current and the current signal changes polarity at a second time; coupling the first current to the first I-V converter and coupling the sum of the second current and the current signal to the second I-V converter; and providing a logic circuit for combining an output of the first I-V converter and an output of the second I-V converter to output the pulse signal, wherein a pulse width of the pulse signal is determined by a difference between the second time and the first time and is linearly proportional to a current level of the current signal.

Further in accordance with the present invention, there is provided a neural network that includes a pulse-width-modulation (PWM) circuit for converting a plurality of current signals into a plurality of pulse signals. The PWM circuit includes a first circuit and a plurality of second circuits. The first circuit includes a first current generator for generating a first current, and a first I-V converter coupled to the first current. Each second circuit is coupled to a corresponding one of the plurality of current signals for converting the corresponding current signal into a corresponding one of the plurality of pulse signals, each second circuit including a second current generator for generating a second current, a second I-V converter coupled to the corresponding current signal and the second current, and a logic circuit coupled to the second I-V converter and the first I-V converter for outputting the corresponding pulse signal, wherein a pulse width of the corresponding pulse signal represents a current level of the corresponding current signal. The neural network also includes a neuron circuit for multiplying the plurality of current signals with a plurality of weight signals, wherein each of the current signals is multiplied by a corresponding one of the weight signals, and for providing a sum of multiplication products of the current signals with the corresponding pulse signals, the neuron circuit including a synapse multiplier circuit coupled to the PWM circuit for multiplying each of the weight signals with a corresponding one of the plurality of pulse signals and for providing a sum of multiplication products of each of the weight signals with the corresponding pulse signal.

Still further in accordance with the present invention, there is provided a neural network that includes one or more pulse-width-modulation (PWM) circuits, each PWM circuit for converting a plurality of current signals into a plurality of pulse signals, each PWM circuit including a first circuit and a plurality of second circuits. The first circuit includes a first current generator for generating a first current, and a first I-V converter coupled to the first current. Each second circuit is coupled to a corresponding one of the plurality of current signals for converting the corresponding current signal into a corresponding one of the plurality of pulse signals, each second circuit including a second current generator for generating a second current, a second I-V converter coupled to the corresponding current signal and the second current, and a logic circuit coupled to the second I-V converter and the first I-V converter for outputting the corresponding pulse signal, wherein a pulse width of the corresponding pulse signal represents a current level of the corresponding current signal. The neural network also includes one or more neuron circuits, each neuron circuit including a synapse multiplier circuit coupled to one of the PWM circuits for multiplying a plurality of weight signals with the plurality of pulse signals generated by one of the PWM circuits, wherein each of the weight signals is multiplied by a corresponding one of the pulse signals, and for providing a sum of multiplication products of each of the weight signals with the corresponding pulse signal.

Additional features and advantages of the invention will be set forth in part in the description which follows, and in part will be obvious from the description, or may be learned by practice of the invention. The features and advantages of the invention will be realized and attained by means of the elements and combinations particularly pointed out in the appended claims.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are incorporated in and constitute a part of this specification, illustrate embodiments of the invention and, together with the description, serve to explain the features, advantages, and principles of the invention.

In the drawings.

DESCRIPTION OF THE EMBODIMENTS

Reference will now be made in detail to the present embodiments of the invention, examples of which are illustrated in the accompanying drawings. Wherever possible, the same reference numbers will be used throughout the drawings to refer to the same or like parts.

Figure 1:
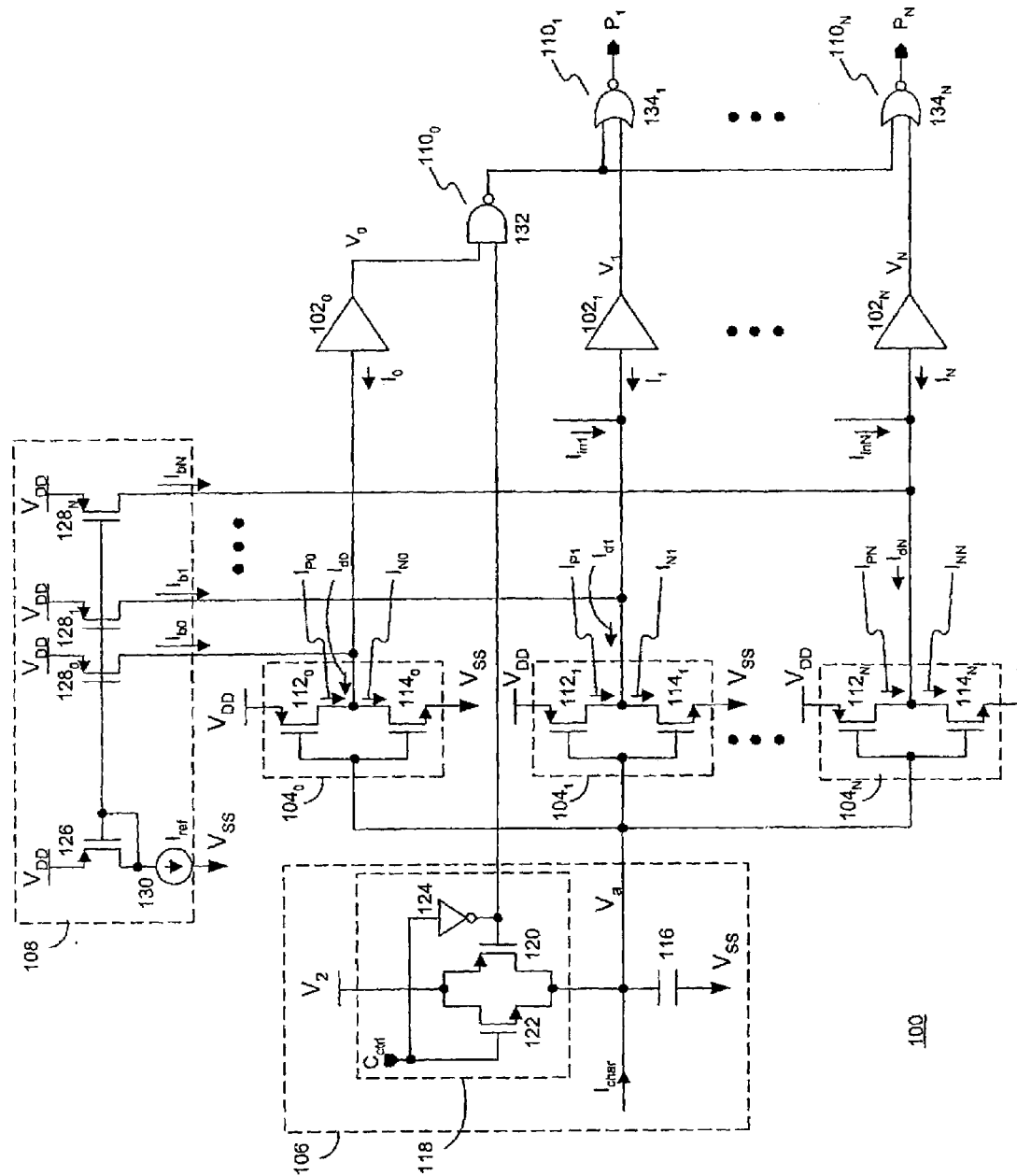
FIG. 1 shows a current-mode pulse-width-modulation circuit consistent with embodiments of the present invention.

An embodiment consistent with the present invention is shown in FIG. 1.

FIG. 1 shows a current-mode pulse-width-modulation (PWM) circuit 100 connectable to a first power supply voltage $V_{DD}$ and a reference voltage or ground $V_{SS}$, for converting a plurality of current signals $I_{in1}, I_{in2}, \ldots, I_{inN}$ into a plurality of pulse signals $P_1, P_2, \ldots, P_N$, respectively. PWM circuit 100 is also connectable to an external control signal $C_{ctrl}$. The control signal $C_{ctrl}$ has a first voltage level to turn PWM circuit 100 on when there are current signals to be converted into pulse signals, and has a second voltage level to turn PWM circuit 100 off in other cases.

Referring to FIG. 1, PWM circuit 100 includes a plurality of current-to-voltage (I-V) converters $102_0, 102_1, \ldots, 102_N$ having current inputs $I_0, I_1, \ldots, I_N$ and voltage outputs $V_0, V_1, \ldots, V_N$, respectively. A plurality of variable current generators $104_0, 104_1, \ldots, 104_N$ are coupled to I-V converters $102_0, 102_1, \ldots, 102_N$, respectively, for generating a plurality of variable currents $I_{d0}, I_{d1}, \ldots, I_{dN}$ that change with time. Current $I_{d0}$ is coupled to I-V converter $102_0$. Both variable currents $I_{dp}$ and current signal $I_{inp}$ are coupled to I-V converter $102_p$, wherein $p=1, 2, \ldots,$ or N. A bias voltage generator 106 provides a bias voltage $V_a$ to all of current generators $104_0, 104_1, \ldots, 104_N$. A current mirror or bias current generator 108 provides a plurality of bias currents $I_{b0}, I_{b1}, \ldots, I_{bN}$ to I-V converters $102_0, 102_1, \ldots, 102_N$, respectively. Therefore, the current input $I_0$ of I-V converter $102_0$ includes two components: variable current $I_{d0}$ and bias current $I_{b0}$, while the current input $I_p$ of I-V converter $102_p$ includes three components: variable current $I_{dp}$, bias current $I_{bp}$, and current signal $I_{inp}$, wherein $p=1, 2, \ldots,$ or N. A plurality of logic circuits $110_0, 110_1, \ldots, 110_N$ are coupled to receive the voltage outputs of I-V converters $102_0, 102_1, \ldots, 102_N$, respectively, for generating pulse signals $P_1, P_2, \ldots, P_N$.

To facilitate description and without limitation, subscript letters k and p are used hereinafter, wherein k can be any and every integer from 0 to N, while p can be any and every integer from 1 to N, if not otherwise specified.

For each I-V converter $102_k$, assuming that a polarity of current input $I_k$ in the direction as shown in FIG. 1 is positive, then $V_k$ output by I-V converter $102_k$ has a high voltage level when $I_k$ is positive, and a low voltage level when $I_k$ is negative.

As shown in FIG. 1, current generator $104_k$ comprises a PMOS transistor $112_k$ and an NMOS transistor $114_k$. Each of PMOS transistor $112_k$ and NMOS transistor $114_k$ comprises a gate (not numbered), a source (not numbered), and a drain (not numbered). The gate of PMOS transistor $112_k$ is coupled to the gate of NMOS transistor $114_k$, and is biased at $V_a$. The source of PMOS transistor $112_k$ is connectable to $V_{DD}$. The source of NMOS transistor $114_k$ is connectable to $V_{SS}$. The drain of PMOS transistor $112_k$ is coupled to the drain of NMOS transistor $114_k$ and is further coupled to I-V converter $102_k$.

Bias voltage generator (referred to as biasing circuit hereinafter) 106 comprises a capacitor 116 and a switch 118. Switch 118 comprises a PMOS transistor 120 and an NMOS transistor 122, each including a gate (not numbered), a source (not numbered), and a drain (not numbered). The control signal $C_{ctrl}$ is directly coupled to the gate of NMOS transistor 122, and is coupled to the gate of PMOS transistor 120 through an inverter 124. One of the source and drain of PMOS transistor 120 is coupled to one of the source and drain of NMOS transistor 122, and is further connectable to a second power supply voltage $V_2$, $V_2$ being equal to one half the first power supply voltage, i.e., $V_{DD}/2$. The other of the source and drain of PMOS transistor 120 is coupled to the other of the source and drain of NMOS transistor 122 and capacitor 116, and is further connectable to a charging current $I_{char}$, wherein the charging current $I_{char}$ can be provided by any current source.

Current mirror 108 comprises a PMOS transistor 126 and a plurality of PMOS transistors $128_0, 128_1, \ldots, 128_N$. Each of PMOS transistors $126, 128_0, 128_1, \ldots, 128_N$ includes a gate (not numbered), a source (not numbered), and a drain (not numbered). The respective gates of PMOS transistors $126, 128_0, 128_1, \ldots, 128_N$ are coupled together and further coupled to the drain of PMOS transistor 126. The sources of PMOS transistors $126, 128_0, 128_1, \ldots, 128_N$ are connectable to $V_{DD}$. The drain of PMOS transistor 126 is biased by a current source 130, which provides a reference current $I_{ref}$. The drain of PMOS transistor $128_k$ is coupled to both I-V converter $102_k$ and current generator $104_k$ for providing the bias current $I_{bk}$.

Logic circuit $110_0$ comprises a two-input NAND gate 132 with one input coupled to the gate of PMOS transistor 120 and the other input coupled to the output $V_0$ of I-V converter $102_0$. Logic circuit $110_p$ comprises a NOR gate $134_p$. NOR gate $134_p$ has two inputs, one being coupled to the output $V_p$ of I-V converter $102_p$, the other being coupled to the output of NAND gate 132.

When PWM circuit 100 is not in operation, the control signal $C_{ctrl}$ has a high voltage level, and PMOS transistor 120 and NMOS transistor 122 are both turned on. As a result, switch 118 is turned on. Therefore, capacitor 116 holds the voltage $V_a$ at $V_2$, i.e., $V_{DD}/2$.

When PWM circuit 100 is ready to convert current signals $I_{in1}, I_{in2}, \ldots, I_{inN}$ into pulse signals $P_1, P_2, \ldots, P_N$, the control signal $C_{ctrl}$ changes to a low level voltage, thereby turning off PMOS transistor 120 and NMOS transistor 122. As a result, switch 118 is turned off. The charging current $I_{char}$ starts to charge capacitor 116, and $V_a$ starts to increase, as determined by equation (1):

$$V_a = V_2 + \frac{I_{char}t}{C} = V_{DD}/2 + \frac{I_{char}}{C}t, \tag{1}$$

wherein C is the capacitance of capacitor 116, and t is time. According to equation (1), $V_a$ changes linearly with time t.

When the output voltage $V_k$ of current generator $104_k$ is within a certain range, i.e., $$V_a + V_{TNk} < V_k < V_a + V_{TPk}, \tag{2}$$

wherein $V_{TNk}$ and $V_{TPk}$ are the threshold voltages of NMOS transistor $114_k$ and PMOS transistor $112_k$, respectively, both PMOS transistors $112_k$ and NMOS transistors $114_k$ are operating in the saturation mode. Therefore, the current $I_{dk}$ generated by current generator $104_k$ can be expressed as a difference between the drain current $I_{Nk}$ of NMOS transistor $114_k$ and the drain current $I_{Pk}$ of PMOS transistor $112_k$, as shown in equation (3):

$$I_{dk} = I_{Nk} - I_{Pk} \tag{3}$$
$$= \frac{1}{2}\beta_{Nk}(V_a - V_{TNk})^2 - \frac{1}{2}\beta_{Pk}(V_a - V_{TPk} - V_{DD})^2,$$

wherein $\beta_{Nk}$ and $\beta_{Pk}$ are transconductance parameters of NMOS transistor $114_k$ and PMOS transistor $112_k$, respectively, When NMOS transistor $114_k$ and PMOS transistor $112_k$ are configured so that $\beta_{Nk} = \beta_{Pk} \equiv \beta_k$ and $V_{TNk} = -V_{TPk} \equiv V_{Tk}$, $$I_{dk} = \beta_k(V_{DD} - 2V_{Tk})(V_a - V_{DD}/2). \tag{4}$$

Combining equations (1) and (4) enables expressing $I_{dk}$ by equation (5):

$$I_{dk} = \beta_k(V_{DD} - 2V_{Tk})\frac{I_{char}}{C}t. \tag{5}$$

Since I-V converter $102_0$ also has the current input component $I_{b0}$, the total current input $I_0$ of I-V converter $102_0$ is determined by equation (6):

$$I_0 = I_{d0} - I_{b0} \tag{6}$$
$$= \beta_0(V_{DD} - 2V_{T0})\frac{I_{char}}{C}t - I_{b0},$$

wherein $V_{T0}$ is the threshold voltage of PMOS transistor $112_0$ and NMOS transistor $114_0$.

For I-V converter $102_p$, the total current input $I_p$ also includes the current signal $I_{inp}$, as shown in equation (7):

$$I_p = \beta_p(V_{DD} - 2V_{Tp})\frac{I_{char}}{C}t - I_{bp} - I_{inp}, \tag{7}$$

wherein $V_{Tp}$ is the threshold voltage of PMOS transistor $112_p$ and NMOS transistor $114_p$.

Assuming $I_{bk}$ has a non-zero value, all of currents $I_0, I_1, \ldots, I_N$ have negative values at time 0, i.e., when the control signal $C_{ctrl}$ first turns on PWM circuit 100, and I-V converters $102_0, 102_1, \ldots, 102_N$ output low voltage signals. Therefore, NAND gate 132 outputs a high voltage signal and all of pulse signals $P_1, P_2, \ldots, P_N$ have low voltage levels.

As the charging current $I_{char}$ begins to charge capacitor 116, currents $I_0, I_1, \ldots, I_N$ increase, and $I_0$ will be the first current to reach a value of 0, at time $t_0$. Time $t_0$ can be determined from equation (6):

$$t_0 = \frac{I_{b0}}{\beta_0(V_{DD} - 2V_{T0})\frac{I_{char}}{C}}. \tag{8}$$

Therefore, starting from time 0, both inputs of NAND gate 132 have high voltage levels, and NAND gate 132 outputs a low level voltage signal to NOR gate $134_p$. Since the other input of NOR gate $134_p$, which is the output of I-V converter $102_p$, is still low, the pulse signal $P_p$ output by NOR gate $134_p$ changes to a high level voltage.

As the charging current $I_{char}$ continues to charge capacitor 116 and $V_a$ increases, at time $t_p$, the total current input $I_p$ of I-V converter $102_p$ reaches a value of 0, I-V converter $102_p$ outputs a high level voltage to NOR gate $134_p$, and the output $P_p$ of NOR gate $134_p$ changes to a low level voltage. Time $t_p$ can be determined from equation (7):

$$t_p = \frac{I_{bp} + I_{inp}}{\beta_p(V_{DD} - 2V_{Tp})\frac{I_{char}}{C}}. \quad (9)$$

Therefore, the pulse signal $P_p$ output by NOR gate $134_p$ starts as a low level voltage at time 0, changes to a high level voltage at time $t_0$, and drops to a low level voltage at time $t_p$. Pulse signal $P_p$ thus has a pulse width $T_p$ determined by a difference between time $t_p$ and time $t_0$, as shown in equation (10):

$$T_p = t_p - t_0 \quad (10)$$
$$= \frac{I_{bp} + I_{inp}}{\beta_p(V_{DD} - 2V_{Tp})\frac{I_{char}}{C}} - \frac{I_{b0}}{\beta_0(V_{DD} - 2V_{T0})\frac{I_{char}}{C}}.$$

In one aspect, all of PMOS transistors $112_0, 112_1, \ldots, 112_N$ are substantially identical, all of NMOS transistors $114_0, 114_1, \ldots, 114_N$ are substantially identical, and all of PMOS transistors $128_0, 128_1, \ldots, 128_N$ are substantially identical. As a result, bias currents $I_{b0}, I_{b1}, \ldots, I_{bN}$ generated by current mirror 108 have the same value $I_b$, as shown in equation (11), $$I_{b0} = I_{b1} = \ldots = I_{bN} = I_b, \quad (11)$$

If NMOS transistor $114_k$ and PMOS transistor $112_k$ are further configured so that $\beta_{Nk} = \beta_{Pk} = \beta_k$ and $V_{TNk} = -V_{TPk} = V_{Tk}$, then all of PMOS transistors $112_0, 112_1, \ldots, 112_k$ and NMOS transistors $114_0, 114_1, \ldots, 114_N$ have the same transconductance parameter $\beta$ and the same threshold voltage $V_T$, as shown in equations (12) and (13), respectively, $$\beta_0 = \beta_1 = \ldots = \beta_N = \beta, \quad (12)$$

$$V_{T0} = V_{T1} = \ldots = V_{TN} = V_T. \quad (13)$$

From equation (5), the currents $I_{d0}, I_{d1}, \ldots, I_{dN}$ generated by current generators $104_0, 104_1, \ldots, 104_N$, respectively, also have the same value $I_d$, as shown in equation (14), $$I_{d0} = I_{d1} = \ldots = I_{dN} = I_d. \quad (14)$$

Under these conditions, all of the currents $I_{d0}, I_{d1}, \ldots, I_{dN}$ have the same time coefficient, i.e., $$\beta(V_{DD} - 2V_T)\frac{I_{char}}{C},$$

as shown in equation (5), and equation (10) can be simplified to equation (15):

$$T_p = \frac{I_{inp}}{\beta(V_{DD} - 2V_T)\frac{I_{char}}{C}}. \quad (15)$$

Therefore, the pulse width $T_p$ of pulse signal $P_p$ is linearly proportional to the current level of the $p^{th}$ current signal, $I_{inp}$, and does not depend on the bias current $I_{bp}$. In one aspect, bias currents $I_{b0}, I_{b1}, \ldots, I_{bN}$ are all 0, or current mirror 108 does not exist, and then time to reduces to 0, but the pulse width $T_p$ of pulse signal $P_p$ as determined by equation (15) does not change.

However, in practical applications, time delays are generally associated with each part of PWM circuit 100. Therefore, if bias currents $I_{b0}, I_{b1}, \ldots, I_{bN}$ are 0, the rising time of pulse signal $P_p$, i.e., the time required for $P_p$ to change from low level voltage to high level voltage, is determined by the sum of the time delays through logic circuit 118, current generator $104_0$, and I-V converter $102_0$, while the falling time of pulse signal $P_p$, i.e., the time required for $P_p$ to change from high level voltage to low level voltage, is determined by the time delay of I-V converter $102_p$. Therefore, the rising time and falling time of pulse signal $P_p$ are substantially different because they depend on the time delays of different circuit components. As a result, the pulse width $T_p$ of pulse signal $P_p$ may not be precisely linearly proportional to $I_{inp}$.

On the other hand, if all of I-V converters $102_0, 102_1, \ldots, 102_N$ are biased at a non-zero current $I_D$, the rising time of pulse signal $P_p$ only depends on the delay time of I-V converter $102_p$, while the falling time of pulse signal $P_p$ is still determined by the time delay of I-V converter $102_p$. Since the time delays of I-V converters $102_0$ and $102_p$ are substantially equal to each other, the effects thereof in determining the pulse width $T_p$ of pulse signal $P_p$ tend to negate each other, or, at best, cancel each other. As a result, the relationship between the pulse width $T_p$ of pulse signal $P_p$ and $I_{inp}$ has a better linearity.

I-V converter $102_k$ can be any comparator that receives a current input and outputs a voltage signal that has different voltage levels depending on the direction or level of the current input, as described above. In one aspect, I-V converter $102_k$ can be provided as a high-performance continuous-time I-V converter 200, as shown in FIG. 2.

Figure 2:
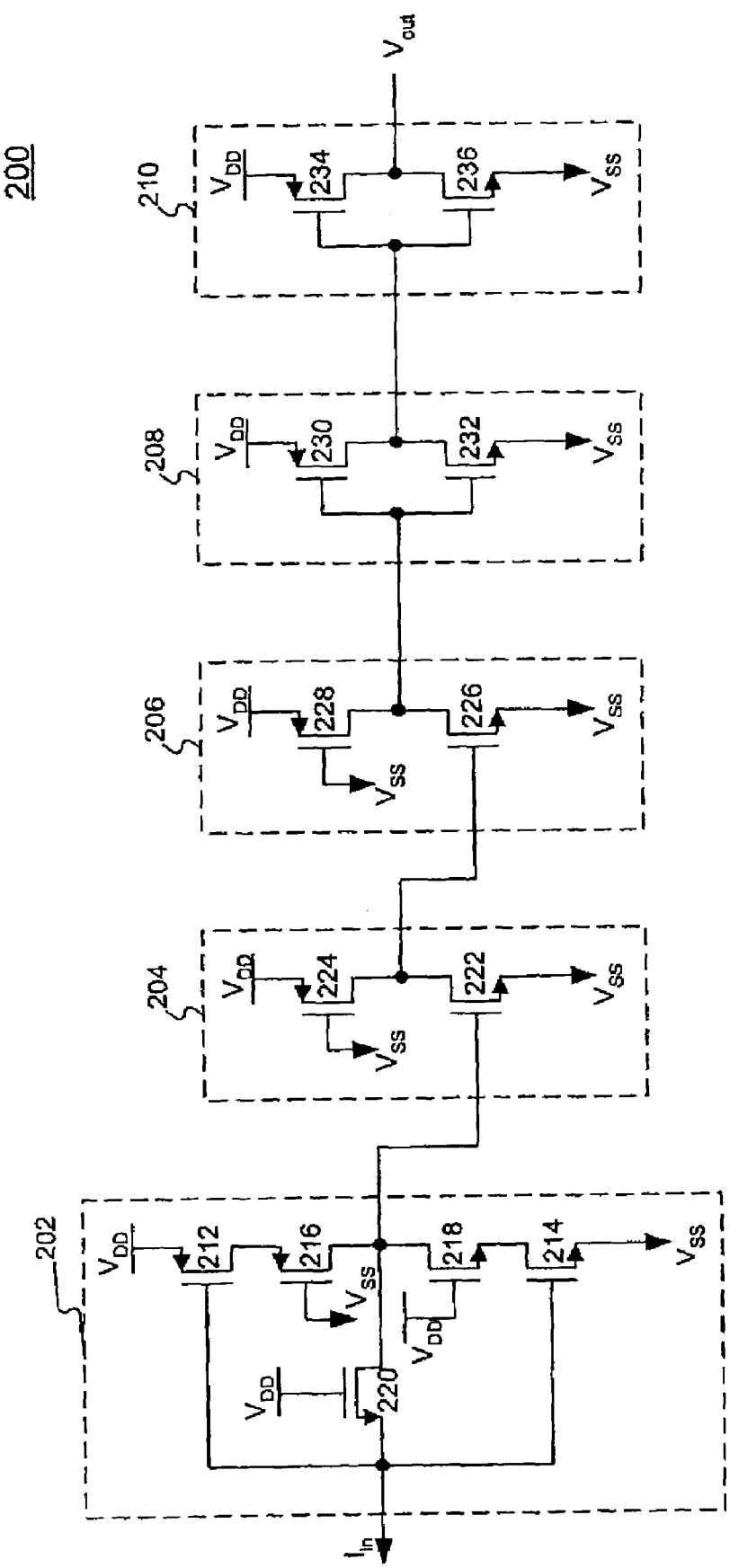
FIG. 2 shows a continuous-time I-V converter that is used in the circuit of FIG. 1.

Referring to FIG. 2, I-V converter 200 receives a current input $I_{in}$ and outputs a voltage signal $V_{out}$. I-V converter 200 comprises a CMOS current amplifier 202, inverting amplifiers 204 and 206, and CMOS inverters 208 and 210.

CMOS current amplifier 202 comprises a first pair of CMOS transistors consisting of a PMOS transistor 212 and an NMOS transistor 214, a second pair of CMOS transistors consisting of a PMOS transistor 216 and an NMOS transistor 218, and an NMOS transistor 220. Each of transistors 212, 214, 216, 218, and 220 includes a gate (not numbered), a source (not numbered), and a drain (not numbered). The gate of PMOS transistor 212 is coupled to the gate of NMOS transistor 214, and is also coupled to the current input $I_{in}$. The source of PMOS transistor 212 is connectable to $V_{DD}$. The drain of PMOS transistor 212 is coupled to the source of PMOS transistor 216. The source of NMOS transistor 214 is connectable to ground, or $V_{SS}$. The drain of NMOS transistor 214 is coupled to the source of NMOS transistor 218. The gate of PMOS transistor 216 is connectable to ground. The drain of PMOS transistor 216 is coupled to the drain of NMOS transistor 218. The gate of NMOS transistor 218 is connectable to $V_{DD}$. One of the drain and source of NMOS transistor 220 is coupled to the gates of PMOS transistor 212 and NMOS transistor 214, and the other of the drain and source of NMOS transistor 220 is coupled to the drains of PMOS transistor 216 and NMOS transistor 218.

Inverting amplifier 204 comprises an NMOS transistor 222 and a PMOS transistor 224 as a resistive load for NMOS transistor 222, each of transistors 222 and 224 including a gate (not numbered), a source (not numbered), and a drain (not numbered). The gate of NMOS transistor 222 is coupled to the output of CMOS current amplifier 202 at the drains of PMOS transistor 216 and NMOS transistor 218. The source of NMOS transistor 222 is connectable to ground. The drain of NMOS transistor 222 is coupled to the drain of PMOS transistor 224. The gate of PMOS transistor 224 is connectable to ground. The source of PMOS transistor 224 is connectable to $V_{DD}$.

Inverting amplifier 206 comprises an NMOS transistor 226 and a PMOS transistor 228 as a resistive load for NMOS transistor 226, each of transistors 226 and 228 including a gate (not numbered), a source (not numbered), and a drain (not numbered). The gate of NMOS transistor 226 is coupled to the output of inverting amplifier 206 at the drains of NMOS transistor 222 and PMOS transistor 224. The source of NMOS transistor 226 is connectable to ground. The drain of NMOS transistor 226 is coupled to the drain of PMOS transistor 228. The gate of PMOS transistor 228 is connectable to ground. The source of PMOS transistor 228 is connectable to $V_{DD}$.

Inverter 208 comprises a pair of CMOS transistors consisting of a PMOS transistor 230 and an NMOS transistor 232, each including a gate (not numbered), a source (not numbered), and a drain (not numbered). The gates of both PMOS transistor 230 and NMOS transistor 232 are coupled to the output of inverting amplifier 206 at the drains of NMOS transistor 226 and PMOS transistor 228. The source of PMOS transistor 230 is connectable to $V_{DD}$. The drains of PMOS transistor 230 and NMOS transistor 232 are coupled to each other. The source of NMOS transistor 232 is connectable to ground.

Inverter 210 comprises a pair of CMOS transistors, a PMOS transistor 234 and an NMOS transistor 236, each including a gate (not numbered), a source (not numbered), and a drain (not numbered). The gates of both PMOS transistor 234 and NMOS transistor 236 are coupled to the output of inverter 208 at the drains of PMOS transistor 230 and NMOS transistor 232. The source of PMOS transistor 234 is connectable to $V_{DD}$. The drains of PMOS transistor 234 and NMOS transistor 236 are coupled to each other. The source of NMOS transistor 236 is connectable to ground.

The input resistance $R_{in}$ of CMOS current amplifier 202 comprises three components in parallel: the resistance looking into the gate of PMOS transistor 212, the resistance looking into the gate of NMOS transistor 214, and the resistance looking into NMOS transistor 220. Since the currents into the gates of PMOS transistor 212 and NMOS transistors 214 are gate leakage currents and are very small, the resistances looking into the gates of PMOS transistor 212 and NMOS transistor 214 can be ignored. Therefore, $R_{in}$ is substantially equal to the resistance looking into NMOS transistor 220. Similarly, the current into the gate of NMOS transistor 222 is also a gate leakage current and is very small. As a result, the resistance looking into NMOS transistor 220 can be considered as the parallel combination of the on resistance of PMOS transistors 212 and 216 and the on resistance of NMOS transistors 218 and 214, further in series with the on resistance of NMOS transistor 220. Therefore, Rin can be approximated by equation (16):

$$R_{in} \approx (R_{212}+R_{216})//(R_{214}+R_{218})+R_{220}, \quad (16)$$

wherein $R_{212}$, $R_{214}$, $R_{216}$, $R_{218}$, and $R_{220}$ are the on resistances of PMOS transistor 212, NMOS transistor 214, PMOS transistor 216, NMOS transistor 218, and NMOS transistor 220, respectively.

Because the on resistance of an MOS transistor is very small, from equation (16), the input resistance $R_{in}$ Of CMOS current amplifier 202 is very small, which means the input current $I_{in}$ will only induce a small change in the input voltage $V_i$ at the gates of PMOS transistor 212 and NMOS transistor 214. Moreover, the difference between the output voltage, i.e., the voltage at the drains of PMOS transistor 216 and NMOS transistor 218, and the input voltage of CMOS current amplifier 202 is determined by the current through and the on resistance $R_{220}$ of NMOS transistor 220. Therefore, a change in the output voltage of CMOS current amplifier 202 is also very small. As a result, the response time of CMOS current amplifier 202 required to generate such a small change in the output voltage is also small.

Inverting amplifiers 204 and 206 serve to amplify the small change in the output voltage of CMOS current amplifier 202, and inverters 208 and 210 act as a buffer circuit to increase a driving power of I-V converter 200. Because the time delays associated with inverting amplifiers 204 and 206 and inverters 208 and 210 are generally very small, I-V converter 200 in general has a very fast response time.

Because transistors 212 and 214 both work in the saturation mode, the current through PMOS transistor 212 and NMOS transistor 214 is large. Adding PMOS transistor 216 and NMOS transistor 218 helps reduce the current through transistors 212 and 214, thereby reducing power consumption of current amplifier 202.

Figure 3:
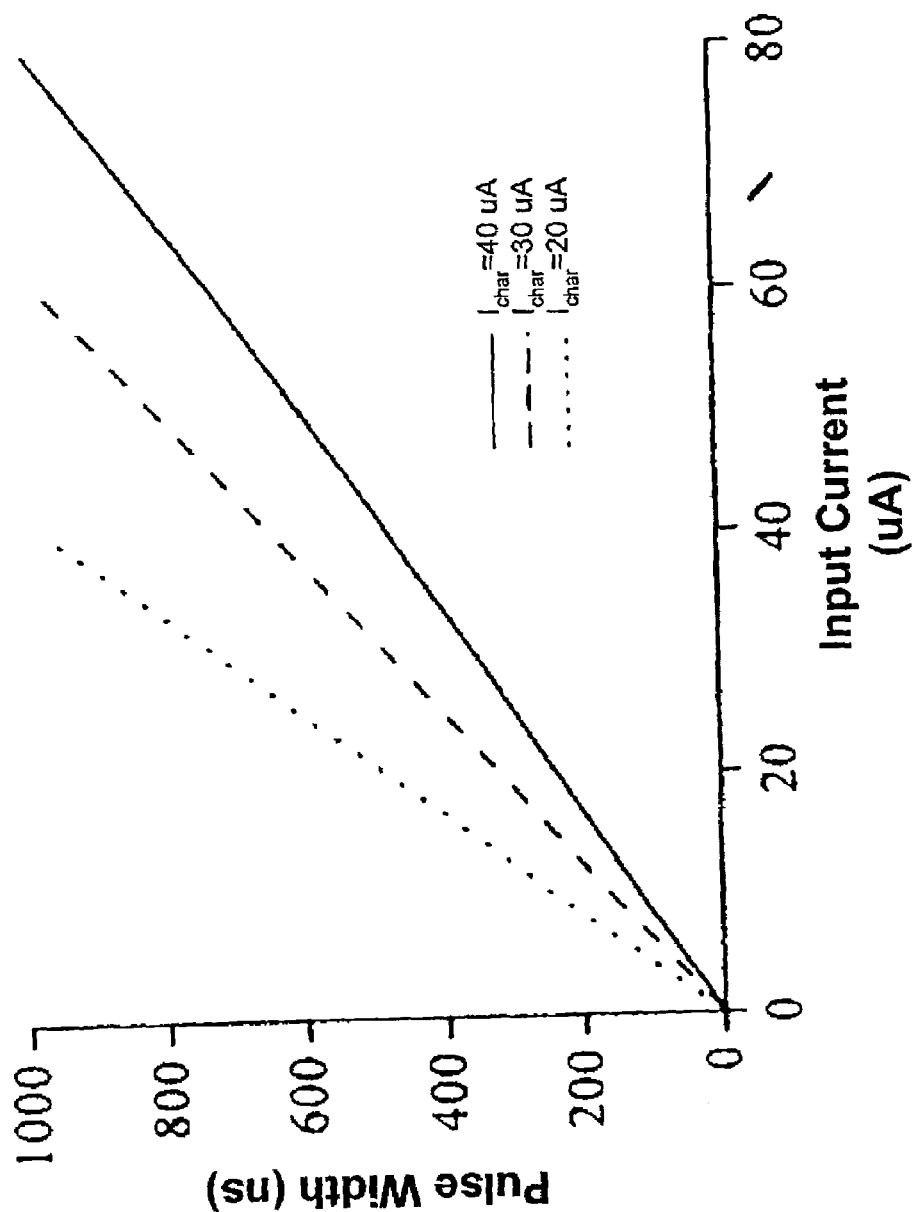
FIG. 3 graphically illustrates simulation results for operation of the circuit of FIG. 1.

FIG. 3 is a graphical illustration of simulation results of the width of a pulse signal generated by PWM circuit 100 versus the current signal input to PWM circuit 100. The model used for the transistors in PWM circuit 100 is the Spectre model for 1.2 μm CMOS technologies, which is well-known to one skilled in the art. Referring to FIG. 3, three lines representing different levels of charging current $I_{char}$ show that a relationship between the pulse width of the pulse signal and the current signal has very good linearity. The dotted line is for $I_{char}$=20 μA; the dashed line is for $I_{char}$=30 μA; and the solid line is for $I_{char}$=40 μA. As demonstrated by the simulation results shown in FIG. 3, the linear coefficient of the pulse width versus the current signal, i.e., the slope of each line, decreases with increasing charging current $I_{char}$. A linear fitting error for the simulated result for $I_{char}$=40 μA (solid line) is less than 1%.

Figure 4:
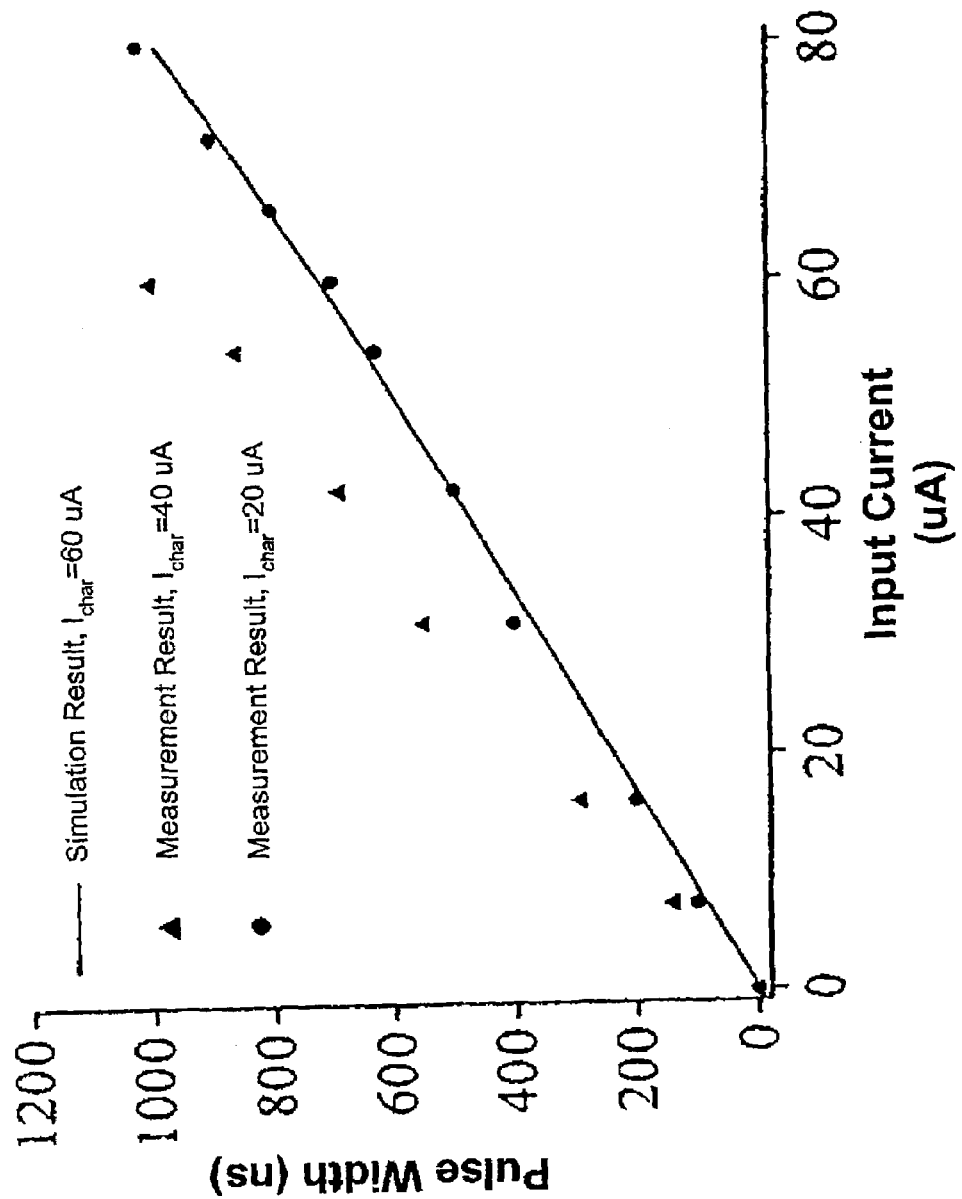
FIG. 4 graphically illustrates a measurement result of the circuit of FIG. 1.

PWM circuit 100 was fabricated and operating characteristics were measured. FIG. 4 graphically illustrates two sets of the measurement results of the pulse width of a pulse signal generated by fabricated PWM circuit 100 versus a current signal input to that PWM circuit 100. The triangular dots represent the measurement results for $I_{char}$=40 μA, the round dots represent the measurement results for $I_{char}$=60 μA, and the solid line represents simulation results for $I_{char}$=60 μA. The measurement results fit the simulation results very well.

The simulation and measurement results as shown in FIGS. 3 and 4 indicate desirable features of PWM circuit 100 for applications in neural networks.

Figure 5:
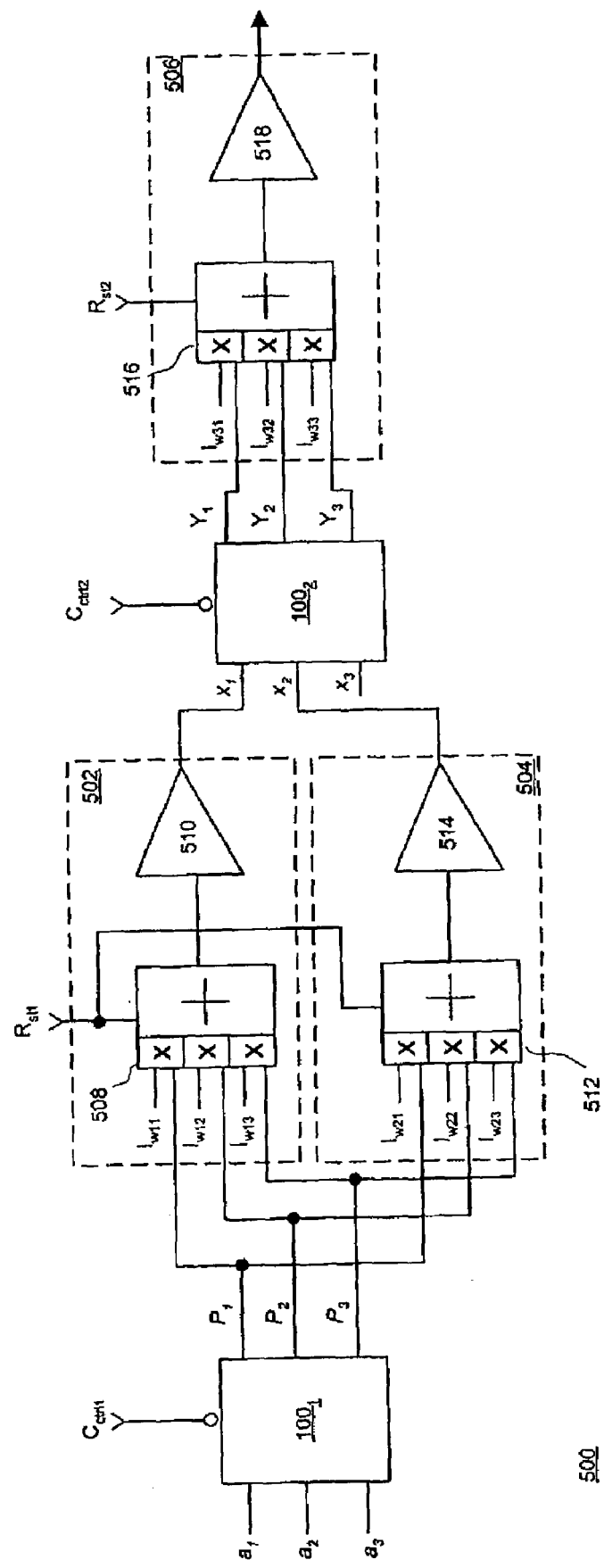
FIG. 5 shows a neural network circuit that includes a pulse-width-modulation circuit consistent with the present invention.

FIG. 5 shows a neural network circuit 500 that employs PWM circuit 100.

Referring to FIG. 5, neural network 500 includes two PWM circuits, $100_1$ and $100_2$. PWM circuit $100_1$ converts current signals $a_1$, $a_2$, and $a_3$ into pulse signals $P_1$, $P_2$, and $P_3$, respectively. PWM circuit $100_2$ converts current signals $x_1$, $x_2$, and $x_3$ into pulse signals $Y_1$, $Y_2$, and $Y_3$, respectively. PWM circuit $100_1$ is coupled to an external control signal $C_{ctrl1}$, and PWM circuit $100_2$ is coupled to an external control signal $C_{ctrl2}$. Control signals $C_{ctrl1}$ and $C_{ctrl2}$ switch on and off PWM circuits $100_1$ and $100_2$, respectively.

Neural network circuit 500 also includes three neurons, 502, 504, and 506, each for multiplying a plurality of weight signals with a plurality of pulse signals. Neuron 502 is coupled to PWM circuit $100_1$ to receive pulse signals $P_1$, $P_2$, and $P_3$, and multiply weight signals $I_{w11}$, $I_{w12}$, and $I_{w13}$ with pulse signals $P_1$, $P_2$, and $P_3$, respectively; neuron 504 is also coupled to PWM circuit $100_1$ to receive pulse signals $P_1$, $P_2$, and $P_3$, and multiply weight signals $I_{w21}$, $I_{w22}$, and $I_{w23}$ with pulse signals $P_1$, $P_2$, and $P_3$, respectively; and neuron 506 is coupled to PWM circuit $100_2$ to receive pulse signals $Y_1$, $Y_2$, and $Y_3$, and multiply weight signals $I_{w31}$, $I_{w32}$, and $I_{w33}$ with pulse signals $Y_1$, $Y_2$, and $Y_3$, respectively.

Each of neurons 502, 504, and 506 has a synapse multiplier for multiplying the weight signals with the pulse signals, and a transfer function circuit for outputting a signal in accordance with the sum of the multiplication products. In particular, neuron 502 has a synapse multiplier 508 and a transfer function circuit 510, neuron 504 has a synapse multiplier 512 and a transfer function circuit 514, and neuron 506 has a synapse multiplier 516 and a transfer function circuit 518.

Synapse multiplier 508 is coupled to PWM circuit $100_1$ to receive pulse signals $P_1$, $P_2$, and $P_3$, multiply them with weight signals $I_{w11}$, $I_{w12}$, and $I_{w13}$, respectively, and output the sum of the three multiplication products. Synapse multiplier 512 is also coupled to PWM circuit $100_1$ to receive pulse signals $P_1$, $P_2$, and $P_3$, multiply them with weight signals $I_{w21}$, $I_{w22}$, and $I_{w23}$, respectively, and output the sum of the three multiplication products. Synapse multiplier 516 is coupled to PWM circuit $100_2$ to receive pulse signals $Y_1$, $Y_2$, and $Y_3$, multiply them with weight signals $I_{w31}$, $I_{w32}$, and $I_{w33}$, respectively, and output the sum of the three multiplication products. An external control signal $R_{st1}$ is coupled to both synapse multipliers 508 and 512, and an external control signal $R_{st2}$ is coupled to synapse multiplier 516. Control signals $R_{st1}$ and $R_{st2}$ switch on and off the three synapse multipliers.

Each of transfer function circuits 510, 514, and 518 has an input terminal coupled to the output of its corresponding synapse multiplier, and an output terminal. The output of transfer function circuit 510 is coupled to PWM circuit $100_2$ as input signal $x_1$. The output of transfer function circuit 514 is coupled to PWM circuit $100_2$ as input signal $x_2$. The output of transfer function circuit 518 is the output of neural network circuit 500.

While FIG. 5 illustrates neural network 500 in which PWM circuits $100_1$ and $100_2$ are external to neurons 502, 504, and 506, the scope of the invention is not so limited. Embodiments in which one or more neurons of a neural network include therein a PWM circuit that generates pulse signals for processing weight signals within the neuron, are also consistent with the invention.

It will be apparent to those skilled in the art that various modifications and variations can be made in the disclosed process without departing from the scope or spirit of the invention. Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A pulse-width-modulation (PWM) circuit for converting a current signal to a pulse signal, comprising;
   a first current generator for generating a first current that changes with time;
   a first I-V converter coupled to the first current generator for receiving the first current;
   a second current generator for generating a second current that changes with time;
   a second I-V converter coupled to receive the current signal and coupled to the second current generator to receive the second current; and
   a logic circuit coupled to the first and second I-V converters for outputting the pulse signal, a pulse width of the pulse signal representing a current level of the current signal.

2. The circuit of claim 1, wherein the first and second currents linearly change with time.

3. The circuit of claim 1, wherein the first and second currents are equal to each other.

4. The circuit of claim 1, wherein each of the first and second current generators comprises a pair of MOS transistors.

5. The circuit of claim 1, wherein each of the first and second I-V converters has a current input and a voltage output, wherein the voltage output has a high voltage level when the current input is in one direction and a low voltage level when the current input is in an opposite direction.

6. The circuit of claim 1, wherein each of the first and second I-V converters comprises a CMOS current amplifier, a first inverting amplifier, a second inverting amplifier, a first inverter, and a second inverter serially coupled to one another, wherein the CMOS current amplifier of the first I-V converter receives the first current, and wherein the CMOS current amplifier of the second I-V converter receives the current signal and the second current.

7. The circuit of claim 1, wherein the first I-V converter outputs a high voltage signal at a first time and the second I-V converter outputs a high voltage signal at a second time, wherein a difference between the second time and the first time is linearly proportional to the current level of the current signal.

8. The circuit of claim 1, wherein the pulse width of the pulse signal is linearly proportional to the current level of the current signal.

9. The circuit of claim 1, further comprising a bias current generator for a generating a first bias current and a second bias current coupled to the first and second I-V converters, respectively.

10. The circuit of claim 9, wherein the bias current generator comprises a current mirror providing the first and second bias currents as current outputs.

11. The circuit of claim 9, wherein the first bias current is equal to the second bias current.

12. The circuit of claim 1, further comprising a bias voltage generator circuit for providing a bias voltage to the first and second current generators.

13. The circuit of claim 12, wherein the bias voltage generator comprises a switch and a capacitor, wherein the PWM circuit is connectable to a power supply voltage, and wherein the capacitor is coupled to one half the power supply voltage through the switch.

14. The circuit of claim 12, wherein the bias voltage generator comprises a capacitor and is connectable to a charging current and a control signal, wherein the capacitor is charged by the charging current when the control signal has a first voltage level and is coupled to a power supply voltage when the control signal has a second voltage level.

15. The circuit of claim 12, wherein the bias voltage changes linearly with time.

16. A pulse-width-modulation (PWM) circuit for converting a plurality of current signals into a plurality of pulse signals, comprising:
    a first circuit, including
      a first current generator for generating a first current, and
      a first I-V converter coupled to the first current; and
    a plurality of second circuits, each coupled to a corresponding one of the plurality of current signals for converting the corresponding current signal into a corresponding one of the plurality of pulse signals, each second circuit including a second current generator for generating a second current, a second I-V converter coupled to the corresponding current signal and the second current, and a logic circuit coupled to the second I-V converter and the first I-V converter for outputting the corresponding pulse signal, wherein a pulse width of the corresponding pulse signal represents a current level of the corresponding current signal.

17. The circuit of claim 16, wherein each of the first current generator and the second current generators of the plurality of second circuits comprises a pair of MOS transistors.

18. The circuit of claim 16, wherein each of the first I-V converter and the second I-V converters of the plurality of second circuits comprises a CMOS current amplifier, a first and a second inverting amplifier, and a first and a second inverter serially coupled to one another.

19. The circuit of claim 16, wherein each of the first current and the second currents of the plurality of second circuits linearly changes with time in accordance with a coefficient, and wherein the coefficients of the first current and the second currents of the plurality of second circuits are the same.

20. The circuit of claim 16, further comprising a current mirror for providing a bias current to each of the first I-V converter and the second I-V converters of the plurality of second circuits.

21. The circuit of claim 16, further comprising a bias voltage generator for providing a bias voltage to each of the first current generator and the second current generators of the plurality of second circuits.

22. A method for converting a current signal into a pulse signal, comprising:

providing a first I-V converter and a second I-V converter each having a current input and a voltage output, wherein the voltage output changes between a high voltage level and a low voltage level when the current input changes polarity;

generating a first current and a second current, both of the first and second currents changing with time in accordance with a same coefficient, wherein the first current changes polarity at a first time, and the sum of the second current and the current signal changes polarity at a second time;

coupling the first current to the first I-V converter and coupling the sum of the second current and the current signal to the second I-V converter; and providing a logic circuit for combining an output of the first I-V converter and an output of the second I-V converter to output the pulse signal, wherein a pulse width of the pulse signal is determined by a difference between the second time and the first time and is linearly proportional to a current level of the current signal.

23. A neural network, comprising:

a pulse-width-modulation (PWM) circuit for converting a plurality of current signals into a plurality of pulse signals, comprising a first circuit, including a first current generator for generating a first current, and a first I-V converter coupled to the first current, and a plurality of second circuits, each coupled to a corresponding one of the plurality of current signals for converting the corresponding current signal into a corresponding one of the plurality of pulse signals, each second circuit including a second current generator for generating a second current, a second I-V converter coupled to the corresponding current signal and the second current, and a logic circuit coupled to the second I-V converter and the first I-V converter for outputting the corresponding pulse signal, wherein a pulse width of the corresponding pulse signal represents a current level of the corresponding current signal; and a neuron circuit for multiplying the plurality of current signals with a plurality of weight signals, wherein each of the current signals is multiplied by a corresponding one of the weight signals, and for providing a sum of multiplication products of the current signals with the corresponding pulse signals, comprising a synapse multiplier circuit coupled to the PWM circuit for multiplying each of the weight signals with a corresponding one of the plurality of pulse signals and for providing a sum of multiplication products of each of the weight signals with the corresponding pulse signal.

24. A neural network, comprising:

one or more pulse-width-modulation (PWM) circuits, each for converting a plurality of current signals into a plurality of pulse signals, each PWM circuit comprising a first circuit, including a first current generator for generating a first current, and a first I-V converter coupled to the first current, and a plurality of second circuits, each coupled to a corresponding one of the plurality of current signals for converting the corresponding current signal into a corresponding one of the plurality of pulse signals, each second circuit including a second current generator for generating a second current, a second I-V converter coupled to the corresponding current signal and the second current, and a logic circuit coupled to the second I-V converter and the first I-V converter for outputting the corresponding pulse signal, wherein a pulse width of the corresponding pulse signal represents a current level of the corresponding current signal; and one or more neuron circuits, each comprising a synapse multiplier circuit coupled to one of the PWM circuits for multiplying a plurality of weight signals with the plurality of pulse signals generated by one of the PWM circuits, wherein each of the weight signals is multiplied by a corresponding one of the pulse signals, and for providing a sum of multiplication products of each of the weight signals with the corresponding pulse signal.

* * * * *